(12) United States Patent
Kim

(10) Patent No.: US 9,570,120 B2
(45) Date of Patent: Feb. 14, 2017

(54) MEMORY DEVICE AND OPERATION METHOD THEREOF

(71) Applicant: SK hynix Inc., Gyeonggi-do (KR)

(72) Inventor: Dae-Suk Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/851,901

(22) Filed: Sep. 11, 2015

(65) Prior Publication Data

US 2016/0293229 A1 Oct. 6, 2016

(30) Foreign Application Priority Data

Apr. 6, 2015 (KR) .......................... 10-2015-0048445

(51) Int. Cl.
*G11C 5/02* (2006.01)
*G11C 7/10* (2006.01)
*G11C 5/04* (2006.01)
*G11C 7/20* (2006.01)

(52) U.S. Cl.
CPC . *G11C 7/10* (2013.01); *G11C 5/04* (2013.01); *G11C 7/1045* (2013.01); *G11C 7/20* (2013.01)

(58) Field of Classification Search
CPC ........... G11C 29/08; G11C 5/025; G11C 7/10; G11C 7/1045; G11C 7/20; G11C 5/04
USPC .......................................................... 365/218
See application file for complete search history.

(56) References Cited

U.S. PATENT DOCUMENTS

| | | | | |
|---|---|---|---|---|
| 8,208,325 | B2* | 6/2012 | Urakawa | G11C 29/16 365/200 |
| 2010/0195425 | A1* | 8/2010 | Urakawa | G11C 29/16 365/200 |
| 2012/0195148 | A1* | 8/2012 | Yoko | G11C 5/04 365/219 |
| 2014/0110710 | A1 | 4/2014 | Gorman et al. | |
| 2015/0380061 | A1* | 12/2015 | Matsumoto | G11C 29/08 365/51 |

* cited by examiner

*Primary Examiner* — Richard Elms
*Assistant Examiner* — Xiaochun L Chen
(74) *Attorney, Agent, or Firm* — IP & T Group LLP

(57) ABSTRACT

A memory device may include a plurality of cell arrays, a first interface suitable for inputting/outputting first data between the plurality of cell arrays and a host apparatus, a second interface suitable for inputting/outputting second data between the plurality of cell arrays and a device other than the host apparatus, and a data erasure circuit suitable for erasing the first data of the plurality of cell arrays when a first mode in which the first interface is used switches to a second mode in which the second interface is used.

18 Claims, 4 Drawing Sheets

MEMORY DEVICE AND OPERATION METHOD THEREOF

CROSS-REFERENCE TO RELATED APPLICATION

The present application claims priority of Korean Patent Application No. 10-2015-0048445, filed on Apr. 6, 2015, which is incorporated herein by reference in its entirety.

BACKGROUND

1. Field

Exemplary embodiments of the present invention relate to a memory device and, more particularly, to a technology for improving the data security of a memory device.

2. Description of the Related Art

In most electronic systems, semiconductor memory devices are used as a storage device. Semiconductor memory devices are being developed to increase not only their data storage capacities but also their data processing speeds. Furthermore, various attempts to mount memory devices of higher capacity within a smaller area and to efficiently drive the memory devices are being made.

In order to improve memory device integration, two-dimensional (2D) arrangement methods have been supplanted by three-dimensional (3D) arrangement methods in which memory chips are stacked. High bandwidth memory (HBM) and three-dimensionally stacked (3DS) memory devices generally include an interface for connecting to a host apparatus and a separate interface for tests, etc. However, there may data security issues where data of the host apparatus is lost through the other interface.

SUMMARY

Various embodiments of this invention are directed to a technology for improving the data security of a memory device.

In an embodiment, a memory device may include a plurality of cell arrays, a first interface suitable for inputting/outputting first data between the plurality of cell arrays and a host apparatus, a second interface suitable for inputting/outputting second data between the plurality of cell arrays and a device other than the host apparatus, and a data erasure circuit suitable for erasing the first data of the plurality of cell arrays when a first mode in which the first interface is used switches to a second mode in which the second interface is used.

In an embodiment, a memory device may include an interface chip and a plurality of memory chips stacked over the interface chip and each including a cell array. The interface chip may include a first interface suitable for inputting/outputting first data between the plurality of memory chips and a host, a second interface suitable for inputting/outputting second data between the plurality of memory chips and a device other than the host, and a data erasure circuit suitable for erasing the first data of the plurality of memory chips when a first mode in which the first interface is used switches to a second mode in which the second interface is used.

In an embodiment, an operation method of a memory device may include inputting/outputting first data between a cell array and a host using a first interface in a first mode, inputting/outputting second data between a device other than the host and the cell array using a second interface in a second mode, and erasing the first data of the cell array when switching from the first mode to the second mode.

In an embodiment, a memory device may include an interface chip suitable for inputting/outputting data by using first and second interfaces in first and second modes, respectively, and a plurality of memory chips stacked over the interface chip and suitable for storing the data, wherein the interface chip erases the data of the plurality of memory chips when switching from the first mode to the second mode.

DETAILED DESCRIPTION

Figure 1:
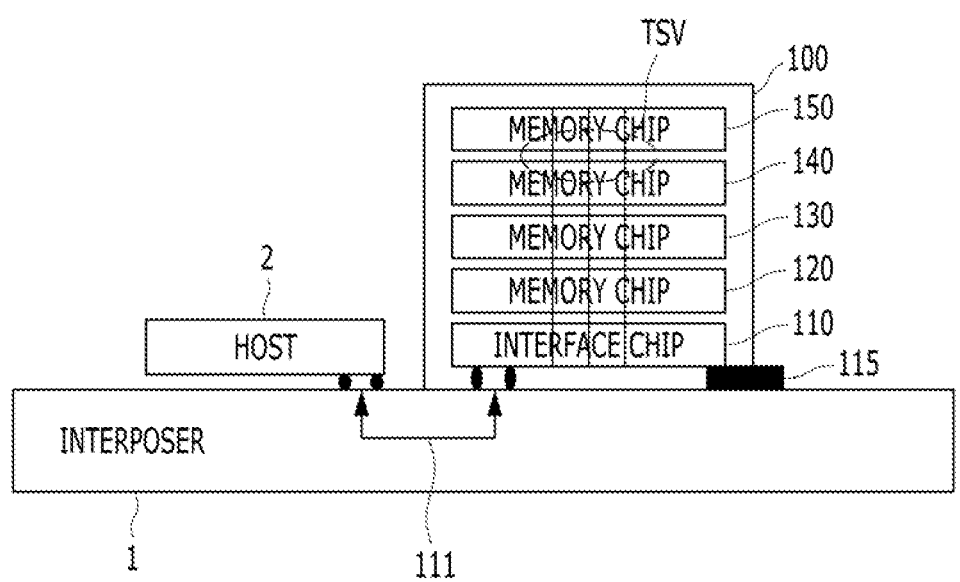
FIG. 1 is a diagram illustrating a memory device 100 in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram illustrating a memory device 100 in accordance with an embodiment of the present invention.

Referring to FIG. 1, the memory device 100 may include a plurality of stacked chips 110~150. An interface chip 110 may be provided at the bottom of the memory device 100 and memory chips 120~150 may be stacked over the interface chip 110. Each of the memory chips 120~150 may include a cell array. The interface chip 110 may include elements for the interface of the memory chips 120~150. The memory chips 120~150 and the interface chip 110 may exchange data through a through silicon via (TSV). The memory chips 120~150 include only elements for storing data and the interface chip 110 includes elements for the interface. Accordingly, redundant circuits having the same functions can be eliminated from the memory device 100 thereby reducing the total area of the memory device 100.

The memory device 100 may be coupled to a host apparatus 2 through an interposer 1. The host apparatus 2 may include a memory controller for controlling the memory device 100. For example, the host apparatus 2 may be a graphic processing unit (GPU) or a central processing unit (CPU) in which the memory controller is embedded.

The interface chip 110 may include two types of interfaces 115. The first interface 111 may be an interface for communication with the host apparatus 2 through the interposer 1. Commands and addresses may be transferred from the host apparatus 2 to the memory device 100 through the first interface 111, and data may be transmitted and received between the host apparatus 2 and the memory device 100.

The second interface 115 may be an interface that enables the memory device 100 to be coupled to other apparatuses for testing the memory device 100 other than the host apparatus 2, for example, test equipment. The second interface 115 may enable the memory device 100 to be directly coupled to the test equipment through pads (or pins or direct access balls) coupled to the interface chip 110. Alternatively, the second interface 115 may enable the memory device 100 to be coupled to the interposer through the pads (or pins or direct access balls) coupled to the interface chip 110, and coupled to the test equipment through the interposer 1. The memory device 100 may be coupled to the test equipment through the second interface 115, thereby enabling the memory device 10 to be tested.

If the memory device 100 includes only the first interface 111, the memory device 100 is unable to be accessed without passing through the host apparatus 2 since the memory device 100 is coupled to the host apparatus 2 through the interposer 1. As a result, it may be difficult to test the memory device 100. If the memory device 100 includes the second interface 115, the memory device 100 may be tested because the memory device 100 can be accessed through the second interface 115 regardless of the host apparatus 2.

If the memory device 100 includes the second interface 115 in addition to the first interface 111, a data security problem may occur. That is, important information about the host apparatus 2 stored in the memory device 100 through the first interface 115 may be accessed and drained by the second interface 115. A technology for solving such data security problems is described below.

In FIG. 1, the memory device 100 includes the interface chip 110 and the memory chips 120~150. In some embodiments, the memory device 100 may be formed of a single chip and the first interface 111, the second interface 115, and the cell arrays may be included in the single chip.

Figure 2:
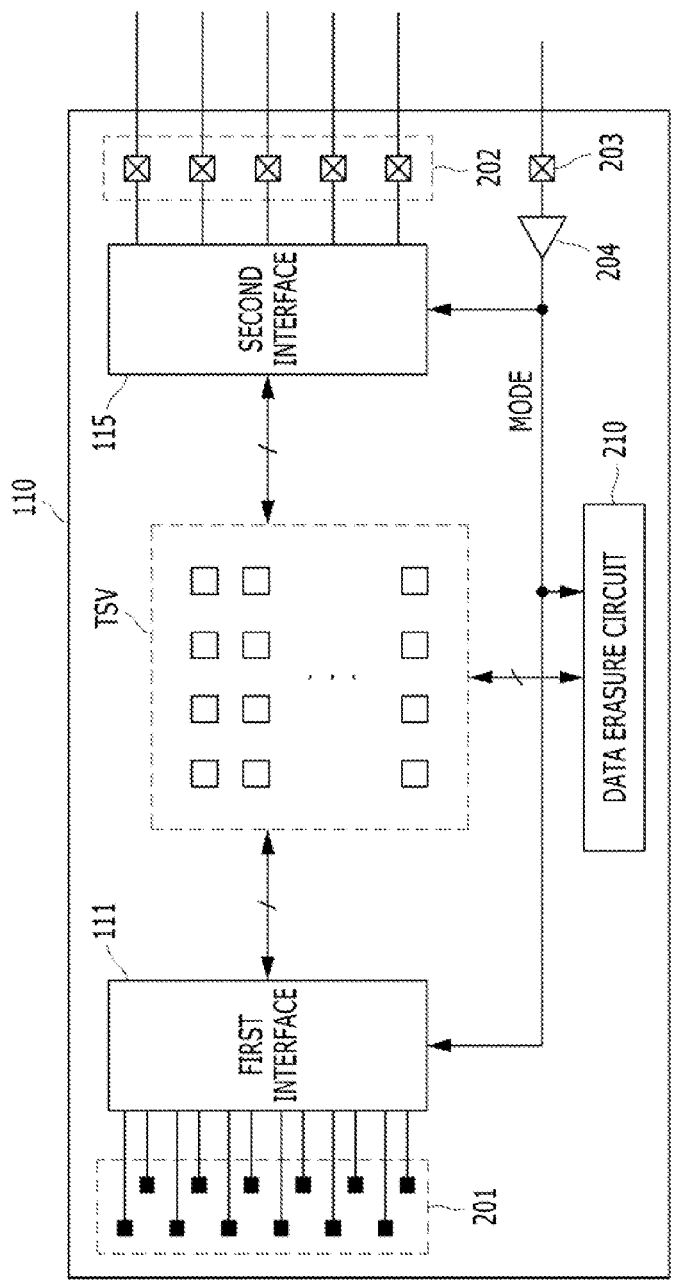
FIG. 2 is a configuration diagram illustrating an embodiment of an interface chip 110 of the memory device 100 of FIG. 1 in accordance with an embodiment of the present invention.

FIG. 2 is a configuration diagram illustrating the interface chip 110 of the memory device 100 of FIG. 1 in accordance with an embodiment of the present invention.

Referring to FIG. 2, the interface chip 110 may include the first interface 111, the second interface 115, and a data erasure circuit 210.

The first interface 111 may receive commands, addresses, data, and signals for controlling the memory device 100 from the host apparatus 2 through micro bumps 201 coupled to the interposer 1. The first interface 111 may process the received signals as suitable signals for the memory chips 120~150 and transfer the processed signals to the memory chips 120~150 through the TSV. If data is to be transferred from the memory chips 120~150 to the host apparatus 2 as in a read operation, the first interface 111 may receive the data read from the memory chips 120~150 through the TSV, may process the received data as suitable data for the host apparatus 2, and may send the processed data to the host apparatus 2 through the micro bumps 201. The first interface 111 may be activated while a first mode is set, that is, while a mode signal MODE is a first level (e.g., a "low" level).

The second interface 115 may be coupled to other apparatuses for testing the memory device 100 than the host apparatus 2 through pads (or pins or direct access balls) 202 coupled to the interface chip 110. The second interface 115 may receive commands, addresses, data, and signals for controlling the memory device 100, for example, from test equipment coupled to the pads 202. Furthermore, the second interface 115 may process the received signals a for the memory chips 120~150 and transfer the processed signals to the memory chips 120~150 through the TSV. Furthermore, if data is to be transferred from the memory chips 120~150 to the test equipment as in a read operation, the second interface 115 may receive the data from the memory chips 120~150 through the TSV, may process the received data as suitable data for the test equipment, and may send the processed data to the test equipment through the pads 202. The second interface 115 may be activated while a second mode is set, that is, while the mode signal MODE is at a second level (e.g., a "high" level). The second interface 115 is not for high-speed data transmission/reception to/from the host apparatus 2, but for testing the memory device 100. Accordingly, the number of pads 202 used by the second interface 115 may be smaller than the number of micro bumps 201 used by the first interface 111.

An interface setting pad 203 may be for setting the first mode and the second mode. If a voltage level of the interface setting pad 203 is at a "low" level, the first mode in which the memory device 100 uses the first interface 111 may be used. If a voltage level of the interface setting pad 203 is at a "high" level, the second mode in which the memory device 100 uses the second interface 115 may be used. A buffer 204 may use the voltage level of the interface setting pad 203 as an input signal and may output the mode signal MODE.

When the first mode switches to the second mode, that is, when the mode signal MODE shifts from a "low" level to a "high" level, the data erasure circuit 210 may be activated and thus erase the data of the memory chips 120~150. The data erasure circuit 210 may erase the data of the memory chips 120~150 by writing data of a predetermined pattern in the memory chips 120~150. For example, the data erasure circuit 210 may erase the data of the memory chips 120~150 by writing data of "0" in all the memory chips 120~150, writing data of "1" in all the memory chips 120~150, or writing data of a repeated pattern of "0101" in all the memory chips 120~150. The data erasure circuit 210 may write data of a predetermined pattern in the memory chips 120~150 through the TSV. If a device other than the host apparatus 2 accesses the memory device 100 through the second interface 115, data stored in the memory chips 120~150 by the host apparatus 2 is erased by the data erasure circuit 210. Secure data stored in the memory chips 120~150 by the host apparatus 2 may be prevented from leaking to the other device. That is, the safety of data security of the memory device 100 can be improved.

Figure 3:
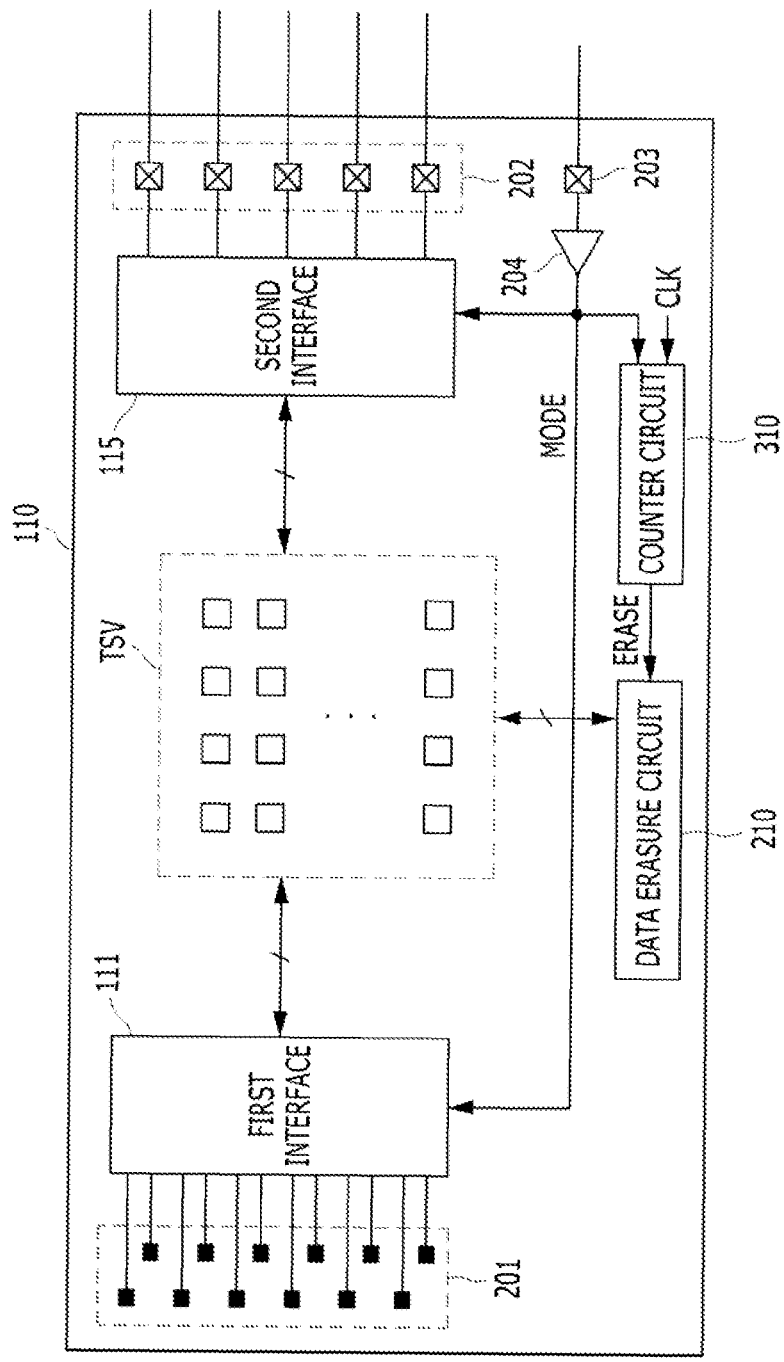
FIG. 3 is a configuration diagram illustrating the interface chip 110 of the memory device 100 of FIG. 1 in accordance with another embodiment of the present invention.

FIG. 3 is a configuration diagram illustrating the interface chip 110 of the memory device 100 of FIG. 1 with another embodiment of the present invention.

Referring to FIG. 3, the interface chip 110 may further include a counter circuit 310 compared to the embodiment of FIG. 2.

A counter circuit 310 may activate an erasure signal ERASE if the mode signal MODE maintains a "high" level for a predetermined time or more, for example, for a cycle of 3 clocks after the mode signal MODE shifts from a "low" level to a "high" level. Specifically, when the mode signal MODE is activated to a "high" level, the counter circuit 310 may be activated, and may count the number of clocks CLK being activated. If the number of clocks CLK that has been activated is three or more, the counter circuit 310 may activate the erasure signal ERASE.

Unlike in the embodiment of FIG. 2, the data erasure circuit 210 may erase the data of the memory chips 120~150 in response to the activation of the erasure signal ERASE.

In the embodiment of FIG. 3, the data of the memory chips 120~150 is not erased right after the mode signal MODE shifts from a "low" level to a "high" level, but the data of the memory chips 120~150 is erased after the mode signal MODE maintains a "high" level for a specific time or more. Accordingly, it may prevent erasing data of the memory chips 120~150 when the mode signal MODE erroneously shifts to a "high" level temporarily due to noise or a glitch.

Figure 4:
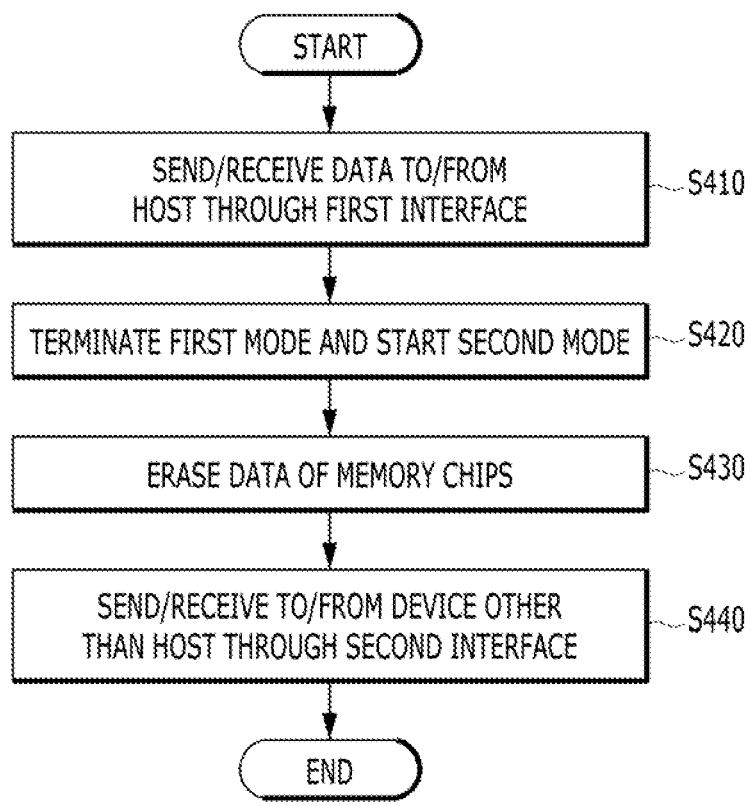
FIG. 4 is a flowchart illustrating the operation of the memory device 100 of FIG. 1.

FIG. 4 is a flowchart illustrating the operation of the memory device 100 of FIG. 1.

Referring to FIG. 4, in the first mode, that is, when the mode signal MODE is a "low" level, data may be inputted and outputted between the memory device 100 and the host apparatus 2 using the first interface 111 at step S410.

The first mode in which the first interface 111 is used may be terminated, and the second mode in which the second interface 115 is used may be started at step S420. That is, the mode signal MODE may shift from a "low" level to a "high" level at step S420.

When the second mode is started, the data erasure circuit 210 may be activated, and thus data stored in the memory chips 120~150 may be erased at step S430. Accordingly, it may avoid the risk that data stored in the memory chips 120~150 by the host apparatus 2 is drained to a device other than the host apparatus 2.

The data may be inputted and outputted between the memory device 100 and the device other than the host apparatus 2 using the second interface 115 at step S440. For example, the memory device 100 may be coupled to test equipment, and the memory device 100 may be tested.

Although various embodiments have been described for illustrative purposes, it will be apparent to those skilled in the art that various changes and modifications may be made without departing from the spirit and scope of the invention as defined in the following claims.

What is claimed is:

1. A memory device, comprising:
   a plurality of cell arrays;
   a first interface suitable for inputting/outputting first data between the plurality of cell arrays and a host apparatus;
   a second interface suitable for inputting/outputting second data between the plurality of cell arrays and a device other than the host apparatus; and
   a data erasure circuit suitable for erasing all of the first data stored in the plurality of cell arrays when a first mode in which the first interface is used switches to a second mode in which the second interface is used.

2. The memory device of claim 1, further comprising:
   an interface setting pad suitable for determining whether to use the first interface or the second interface.

3. The memory device of claim 2, wherein:
   the first interface is activated when a voltage level of the interface setting pad is at a first level; and
   the second interface is activated when the voltage level of the interface setting pad is at a second level.

4. The memory device of claim 2, wherein:
   the first interface is activated when a voltage level of the interface setting pad is at a first level;
   the second interface is activated when the voltage level of the interface setting pad is at a second level; and
   the data erasure circuit erases the first data of the plurality of cell arrays if the voltage level of the interface setting pad shifts from the first level to the second level and maintains the second level for a predetermined time or more.

5. The memory device of claim 1, wherein the data erasure circuit erases the first data of the plurality of cell arrays by writing data of a predetermined pattern in the plurality of cell arrays.

6. The memory device of claim 1, wherein all of the first data is erased by the data erasure circuit before the device other than the host apparatus accesses the plurality of cell arrays through the second interface.

7. The memory device of claim 1, wherein the plurality of cell arrays are configured to serve as a high bandwidth memory (HBM).

8. A memory device, comprising:
   an interface chip; and
   a plurality of memory chips stacked over the interface chip and each comprising a cell array,
   wherein the interface chip comprises:
   a first interface suitable for inputting/outputting first data between the plurality of memory chips and a host;
   a second interface suitable for inputting/outputting second data between the plurality of memory chips and a device other than the host; and
   a data erasure circuit suitable for erasing all of the first data stored in the plurality of memory chips when a first mode in which the first interface is used switches to a second mode in which the second interface is used.

9. The memory device of claim 8, further comprising:
   an interface setting pad coupled to the interface chip and suitable for determining whether to use the first interface or the second interface.

10. The memory device of claim 9, wherein:
    the first interface is activated when a voltage level of the interface setting pad is at a first level; and
    the second interface is activated when the voltage level of the interface setting pad is at a second level.

11. The memory device of claim 9, wherein:
    the first interface is activated when a voltage level of the interface setting pad is at a first level;
    the second interface is activated when the voltage level of the interface setting pad is at a second level; and
    the data erasure circuit erases the first data of the plurality of memory chips if the voltage level of the interface setting pad shifts from the first level to the second level and maintains the second level for a predetermined time or more.

12. The memory device of claim 8, wherein the data erasure circuit erases the first data of the plurality of memory chips by writing data of a predetermined pattern in the plurality of memory chips.

13. The memory device of claim 9, wherein the interface chip further comprises:
    a counter circuit suitable for generating an erasure signal for activating the data erasure circuit if a voltage level of the interface setting pad shifts from a first level to a second level and maintains the second level for a predetermined time or more.

14. An operation method of a memory device, comprising:
    inputting/outputting first data between a cell array and a host using a first interface in a first mode;
    inputting/outputting second data between a device other than the host and the cell array using a second interface in a second mode;
    erasing all of the first data stored in the cell array when switching from the first mode to the second mode.

15. The operation method of claim 14, wherein the erasing the first data of the cell array includes:
    writing data of a predetermined pattern in the cell array.

16. The operation method of claim 14, wherein in the erasing the first data of the cell array, the first data of the cell array are erased if the second mode is maintained for a predetermined time or more.

17. A memory device, comprising:
an interface chip suitable for inputting/outputting data by using first and second interfaces in first and second modes, respectively; and
a plurality of memory chips stacked over the interface chip and suitable for storing the data,
wherein the interface chip erases all of the data stored in the plurality of memory chips when switching from the first mode to the second mode.

18. The memory device of claim 17, wherein:
the interface chip activates the first interface and inputs/outputs first data through the first interface between the plurality of memory chips and a host in the first mode; and
the interface chip activates the second interface and inputs/outputs second data through the second interface between the plurality of memory chips and a test device in the second mode.

* * * * *